US006899814B2

(12) United States Patent
Schneider et al.

(10) Patent No.: US 6,899,814 B2
(45) Date of Patent: May 31, 2005

(54) CREATING A MASK FOR PRODUCING A PRINTING PLATE

(75) Inventors: Josef Schneider, Diedorf (DE); Alfons Schuster, Augsburg (DE); Michael Schönert, Augsburg (DE); Rainer Stamme, Augsburg (DE)

(73) Assignee: MAN Roland Druckmaschinen AG, Offenbach am Main (DE)

( * ) Notice: Subject to any disclaimer, the term of this patent is extended or adjusted under 35 U.S.C. 154(b) by 79 days.

(21) Appl. No.: 10/027,024

(22) Filed: Dec. 20, 2001

(65) Prior Publication Data

US 2002/0092825 A1 Jul. 18, 2002

(30) Foreign Application Priority Data

Dec. 21, 2000 (DE) .......................................... 100 63 819

(51) Int. Cl.[7] .............................. B41C 1/22; B44C 1/22
(52) U.S. Cl. ................................ 216/8; 216/9; 216/10; 216/49; 216/54; 216/105; 216/106; 430/307; 430/310
(58) Field of Search .................................. 216/8–10, 12, 216/49, 54, 105–106; 205/666–668; 430/204, 205, 300–310

(56) References Cited

U.S. PATENT DOCUMENTS

| | | | | |
|---|---|---|---|---|
| 5,278,023 A | * | 1/1994 | Bills et al. ................... | 430/201 |
| 5,382,964 A | * | 1/1995 | Schneider .................... | 347/213 |
| 5,494,774 A | * | 2/1996 | Ali et al. ..................... | 430/200 |
| 5,518,861 A | * | 5/1996 | Coveleskie et al. ......... | 430/200 |
| 5,601,022 A | * | 2/1997 | Dauer et al. ................. | 101/467 |
| 5,608,441 A |   | 3/1997 | Takahashi et al. | |
| 5,756,689 A | * | 5/1998 | Busman et al. ............. | 534/560 |
| 5,840,463 A | * | 11/1998 | Blanchet-Fincher ........ | 430/201 |
| 5,852,975 A | * | 12/1998 | Miyabe et al. ............ | 101/463.1 |
| 5,856,061 A | * | 1/1999 | Patel et al. .................. | 430/201 |
| 6,226,020 B1 | * | 5/2001 | Schuster et al. ............. | 347/176 |
| 6,309,799 B1 | * | 10/2001 | Ruckl .......................... | 430/306 |
| 6,399,270 B1 | * | 6/2002 | Mori et al. ............... | 430/270.1 |
| 6,424,366 B1 | * | 7/2002 | Probian et al. ................ | 34/156 |
| 6,677,010 B1 | * | 1/2004 | Schneider et al. ........ | 428/32.63 |
| 2002/0000170 A1 | * | 1/2002 | Gottling et al. ............. | 101/483 |
| 2002/0020318 A1 | * | 2/2002 | Gallowat et al. ......... | 101/401.1 |
| 2002/0043171 A1 | * | 4/2002 | Loccufier et al. ......... | 101/463.1 |
| 2002/0064717 A1 | * | 5/2002 | Schneider et al. ............. | 430/17 |
| 2002/0096074 A1 | * | 7/2002 | Hartmann et al. .......... | 101/465 |
| 2003/0005838 A1 | * | 1/2003 | Damme et al. ............. | 101/465 |

FOREIGN PATENT DOCUMENTS

| | | | |
|---|---|---|---|
| DE | 41 17 127 | 11/1992 | |
| DE | 4117127 A1 | * 11/1992 | ............. G03F/1/00 |
| DE | 19914323 A1 | * 10/2000 | ............. B41C/1/00 |
| DE | 199 14 323 | 10/2000 | ............. B41C/1/00 |
| JP | 06166162 A | * 6/1994 | ............. B41C/1/00 |
| JP | 1016395 A | * 1/1998 | ........... B41M/5/26 |
| WO | WO 97/44711 | 11/1997 | |

OTHER PUBLICATIONS

Patent Abstracts of Japan, JP 06–166162, Jun. 1994, "*Method for Manufacturing Seamless Printing Plate*".

* cited by examiner

Primary Examiner—Anita Alanko
(74) Attorney, Agent, or Firm—Cohen, Pontani, Lieberman & Pavane

(57) ABSTRACT

In order to simplify the sequence of creating a mask, in particular for producing a printing plate, and at the same time to improve the quality of the printing plate produced by means of a mask, the use of laser-induced thermal transfer is provided. The structure information is applied directly to the surface of a printing plate carrier during the creation of a mask, by means of a thermal transfer film and a laser image-setting unit, so that by means of the structure information applied, differentiation with regard to image points and non-image points can be carried out directly in order to produce a printing plate.

4 Claims, 5 Drawing Sheets

CREATING A MASK FOR PRODUCING A PRINTING PLATE

BACKGROUND OF THE INVENTION

1. Field of the Invention

The invention relates to the creation of a mask for producing a printing plate.

2. Description of the Related Art

It is generally known that, in many technical areas, masks are used for surface treatment (printed circuitboard production) or else for printing processes (gravure printing, in which it is not printing plates which are fitted but the plate cylinder surfaces themselves which are prepared as printing plates) and lithographic processes. The objective is always, by using a material which has properties that differ from a substrate, that is to say a carrier of a material that differs from the mask material, to produce a specific structure (mask) on precisely this substrate. The mask produced in this way is then used as a starting point for further processes. For instance, it is intended to protect the substrate at specific points from the action of other substances.

The typical sequence of a previous method for creating a mask is subdivided into the following steps:

1. creation of a film with the structure information,
2. exposing a suitable photosensitive layer on a substrate through this film by means of a suitable light source,
3. development/cleaning in order to form the structure (mask) on the substrate.

Then, as a further step, for example etching or else the direct use of the mask can follow, for example as a printing plate in screen printing. By means of this mask, all the non-printing points are covered there. The printing ink passes through only at the open points of the mask.

As an alternative to the sequence previously described, the following is also already known:

1. applying an energy-sensitive layer to the substrate,
2. direct exposure or ablation of the structure by means of a suitable energy source, such as a laser or electron beam, which is variable in accordance with image information,
3. development/cleaning in order to form the structure (mask) on the substrate, if required.

This alternative is already used in the production of gravure plates. The mask is generally transferred to the gravure cylinder, a gelatin relief then generally remains on the said cylinder, its thickness corresponding to the tonal value of the diapositive or dianegative. During etching with ferric chloride, the iron salt diffuses through the gelatin and dissolves copper. The etching depth may be controlled largely via the different thickness of the relief, via the choice of appropriate etching bath concentrations and via the etching time.

SUMMARY OF THE INVENTION

On this basis, the object of the invention is to simplify the sequence of mask creation, in particular for producing a printing plate, and at the same time to improve the quality of the printing plates produced by means of a mask.

According to the invention, a thermal transfer film carrying a thermal transfer material is provided in proximity to a surface of a printing plate carrier. The thermal transfer material is selectively ablated using a laser image-setting unit to apply structure information directly to the surface of the printing plate carrier, thereby forming a mask on the printing plate carrier. Image points and non-image points can then be formed directly on the printing plate carrier using the mask in order to produce a printing plate.

In order to create the structure information of a mask, a thermal transfer film is used, which is brought into contact with the substrate, that is to say the surface of the printing plate carrier, by means of a suitable feed device. An energy-sensitive layer can also be applied by directly coating the substrate (e.g. by means of dip coating, doctoring on, spraying on, rolling on or toning with solid or liquid toner) if appropriate in conjunction with a post-drying or hardening step, and the structure information of the mask is placed on this layer.

The creation of the structure information is preferably carried out by means of laser radiation, and for ablation, a power density of more than 500 MW/m$^2$ is provided, pulsed if necessary. In this case, the laser radiation is modulated in a suitable way in accordance with the image or non-image, in order to produce the desired mask.

For example, U.S. Pat. No. 6,226,020 discloses a method and in particular an apparatus for producing a print by using laser-induced thermal transfer by means of a strip-like transfer film and a substrate cylinder. The known apparatus comprises a strip transport mechanism, which cooperates with a traversing unit coupled to the image-setting unit which emits one or more (laser diode array) laser beams. Therefore, the transfer film can be moved uniformly in order to move over the substrate width of a printing plate cylinder, the laser-based thermal printing head, driven in a known way by means of a control unit in accordance with an image to be transferred, introducing heat into the transfer film at each image point and therefore performing the point-by-point transfer of the coating (thermal material) of the transfer film, and it being possible to cover the complete substrate surface via the rotation of the substrate cylinder and traversing parallel to the axis of the substrate cylinder.

In the case of a directly applied energy-sensitive layer, the development/cleaning of the layer can be carried out with a suitable cleaning apparatus, possibly with the aid of cleaning liquids, that is to say cleaning by means of a liquid or particle jet, combined if necessary, or cleaning by means of brushes or cleaning by means of a washing cloth. In addition, following the formation of the mask, the layer can also be further acted on thermally, in order to improve its chemical resistance or mechanical properties.

The method on which the proposal of the invention is therefore based is laser-induced thermal transfer, such as is used for producing the erasable offset printing plates, for example as disclosed in U.S. Pat. No. 5,601,022. The system arrangement comprising the components of laser and strip station, as disclosed by U.S. Pat. Nos. 5,601,022 or 6,226,020 (thermal transfer off-press construction), forms the model for an apparatus for creating masks.

As compared with conventional methods of mask creation, laser-induced thermal transfer offers the advantage of being very fast and precise. By means of laser-induced thermal transfer, the process steps of coating and image setting are combined into one process step. As a result, time and costs can be saved.

The image-setting quality of laser-induced thermal transfer is very high (offset quality), so that extremely fine structures can be depicted.

The thermal transfer material which is known from the prior art previously described and which is applied to the printing plate to be produced is suitable to be used for mask creation by means of exposure, washing out and etching.

The thermal transfer material is opaque (light-resistant), water-resistant and in particular acid-resistant.

The thermal transfer material does not need to be applied separately. If it is applied to thin film strips, strip cassettes tailor-made as is known are used. In addition, both the creation of the mask and the production of a printing plate by means of this mask can be performed within the printing machine.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
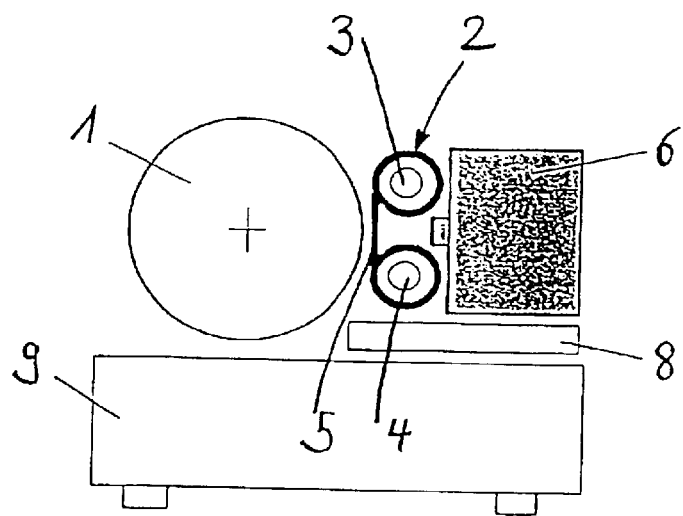
FIG. 1 shows a machine frame with an arrangement of components for mask creation.

FIG. 1 (and FIG. 2) shows a printing plate cylinder 1, on whose surface a mask is to be created. A strip transport mechanism 2, comprising a supply reel 3 and a rewind reel 4, guides a strip-like thermal transfer film 5 close to the surface of the printing plate cylinder 1 or brings it into contact with the surface of the printing plate cylinder 1. A laser image-setting unit 6 focuses one or more laser beams 7 onto the thermal transfer film 5. The laser image-setting unit 6 and the strip guide mechanism 2 are jointly arranged in a known way on a traversing unit 8, by means of which they can be moved over the width of the printing plate cylinder 1 in a machine frame 9.

Figure 2:
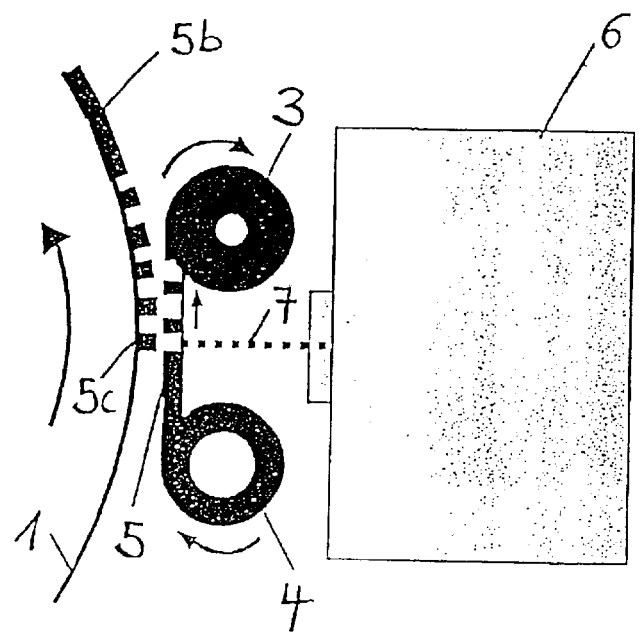
FIG. 2 shows the creation of a mask by means of laser-induced thermal transfer to produce a printing plate.

FIG. 2 shows once more how the apparatus according to FIG. 1 is used in a gravure printing machine in order to produce an etching mask 10 (FIGS. 3 and 4) by means of laser-induced thermal transfer on the surface 11 of a gravure printing cylinder, by thermal transfer material 5b being transferred as image information 5c or structure information for the etching mask 10.

Figure 3:
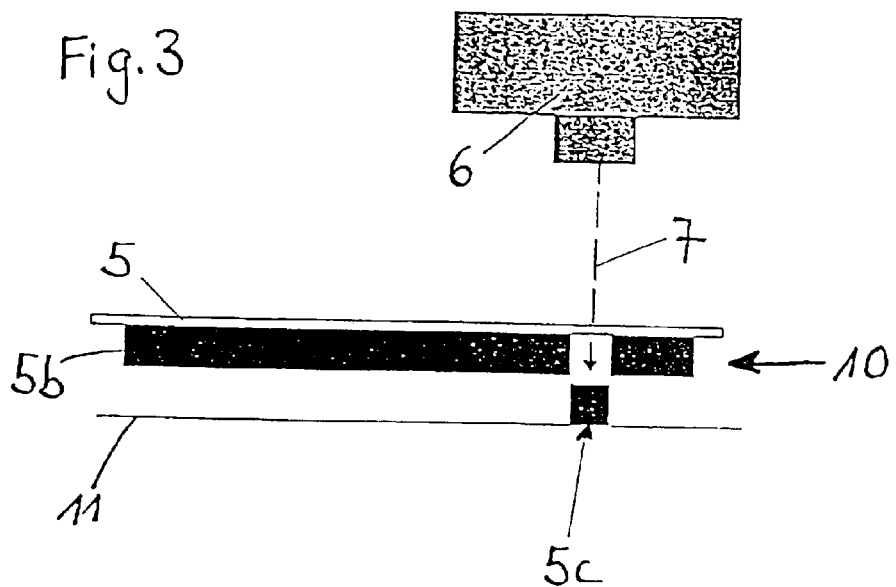
FIGS. 3 to 5 show details of the creation of a mask for producing a gravure printing plate.
Figure 4:
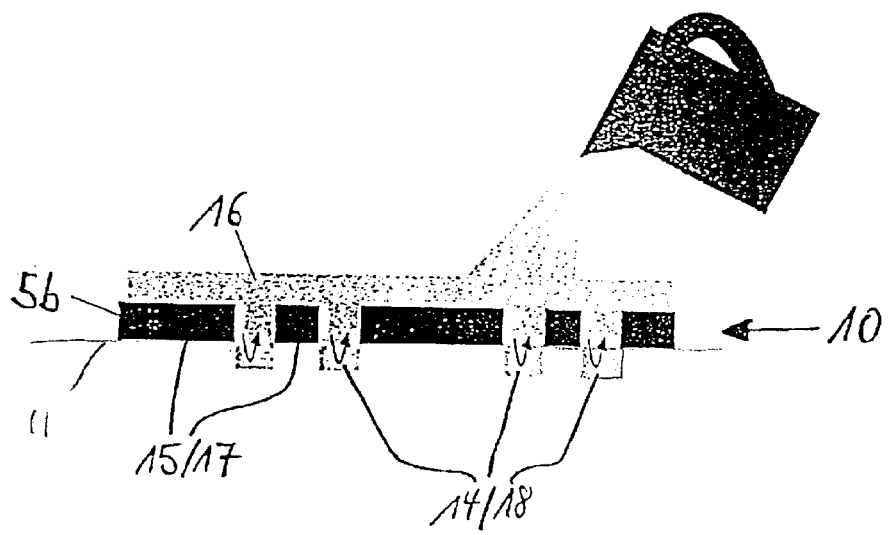
Figure 5:
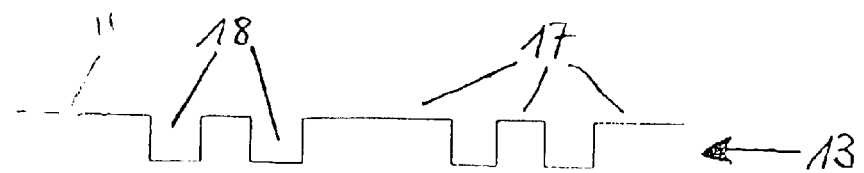

According to FIGS. 3 to 5, the creation of a mask by means of laser-induced thermal transfer can therefore be used for producing a gravure printing plate 13. In this case, an etching method is involved, in which image information can be etched in a conventional way, by means of ironIII chloride ($Fe_3Cl$) onto a printing cylinder having a copper top layer. The process of mask creation for a gravure printing plate is indicated in FIG. 3, and the same reference symbols are used for the same parts as in FIGS. 1 and 2.

FIG. 4 (and FIG. 3) shows the etching process in gravure printing with the aid of an etching mask 10 produced in accordance with the invention. By using this etching mask 10, which has to be applied to the cylinder surface 11, differentiation with regard to image points and non-image points (image information 5c) is carried out. The etching mask 10 is applied as a negative mask from the transfer film 5 in the form of the thermal transfer material 5b, so that the intended image points 14 can be detected as free and non-covering areas. The non-image points 15 must be covered and protected. Following the application of the image-differentiating mask 10, the gravure printing plate 13 can be etched, the application of acid 16 causing the cylinder surface 11 to be attacked and depressed by the etching process at the image points 14, that is to say the unprotected areas, and therefore gravure printing cells 18 being formed. The acid 16 attacks the surface material, generally the copper in the case of gravure printing plates, by means of a chemical reaction, and dissolves the material.

The material 5b, which forms the image-differentiating mask 10, must be resistant to acid and must not be attacked by the latter. This resistance ensures the image differentiation or the image production on the gravure printing plate 13. The mask material 5b is also referred to as an etch resist or etch reserve. The adhesion of the mask material 5b to the printing plate surface 11 must be firm and uniform. It must be ensured that the acid 16 cannot run underneath or flood underneath the mask 10. This adhesive strength simultaneously ensures the production of an image exactly and with sharp edges, which is of utmost significance and a necessity primarily in the case of lines and texts. The doctor-supporting structures (webs 17) needed for gravure printing must in this case be ensured by the laser setting of an image by means of appropriate generation of image data during the mask creation.

For the creation of a mask by means of laser-induced thermal transfer, a polymer material is generally used, which is applied in thin layers to a film carrier. This coated thermal transfer film 5 is wound up onto a supply roll 3, as described at the beginning, and is unwound by an appropriate apparatus during the process of mask creation. The means of guiding the film strip 5 is oriented in such a way that the side of the film 5 coated with the mask material 5b is assigned to the surface of the printing plate cylinder 1. In addition to the film strip guiding means 2, a laser system 6 for producing an image is integrated into the apparatus. This preferably diode-pumped YAG laser system 6 transfers the image signals from a digital database by means of high-energy laser pulses to the rear of the film 5 coated with the mask material 5b. In the process, the distance of the film 5 from the cylinder surface must be very small, so that, as soon as the high-energy laser radiation 7 strikes the rear of the film, the mask material 5b can be transported from the front side of the film to the surface of the cylinder 1 with sufficient exactness and completeness.

The cylinder rotational speed and the speed of the film strip advance are determined by the efficiency of the laser system. The lateral advance in the direction parallel to the axis of the cylinder is predefined by the number of laser diode arrays. The principle of rotational image setting with a laterally traversing advance ensures that it is possible to create a seamless mask on the gravure printing roll to be processed.

Laser-induced mask creation is an autotypical image-forming method, that is to say the image information is applied to a variable area with simultaneous constancy of layer thickness. For successful processing in the etching process, the mask must have been transferred by the negative process. The image points 14, that is to say the gravure printing cells 18, which are intended to be depressed on the gravure printing plate after etching, must be recognizably exposed after the masking operation, that is to say these areas must not be covered by the etching mask 10. The non-image points 15 must be recognizably covered by the negative mask. FIG. 5 shows such an etched gravure printing plate 13 with the etching mask already removed and with etched gravure printing cells 18 and screen webs 17.

The advantage of this laser-induced masking process resides in the simultaneous creation of an etch-resistant mask and the transfer of the image information. By means of this process, the separation between the application of the substrate coating and ablative image setting (that is to say mask creation) is removed. The setting of an image by means of laser diode arrays permits short image-setting times, as a result of lower required power outputs and higher advance speeds in the lateral direction parallel to the axis.

A further advantage is attributable to the quality of the image setting. The resolution power of laser-induced image setting is several times higher than exclusively ablative laser image setting or mechanical gouge engraving. The known weaknesses of gravure printing in reproducing sharp-edged lines and round text elements can be eliminated with this masking process by means of laser-induced thermal transfer.

Figure 6:
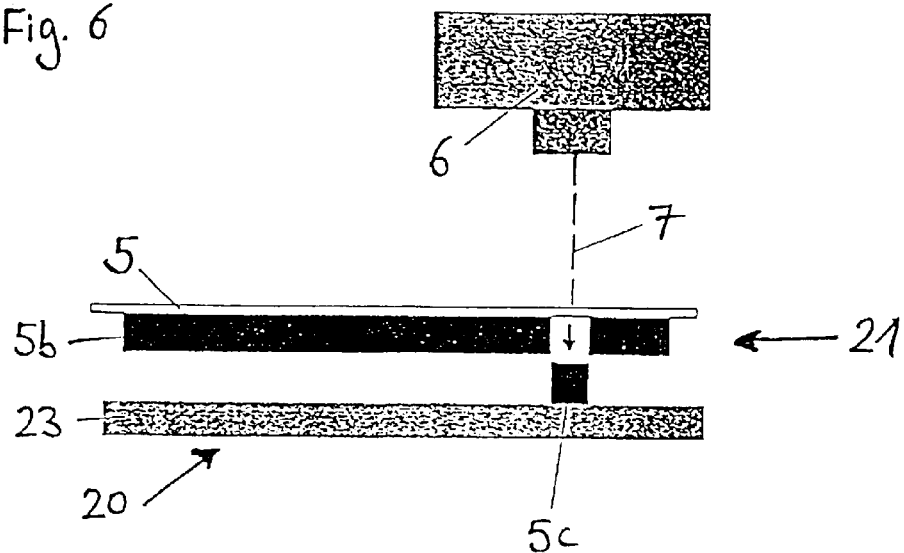
FIGS. 6 to 8 show details of the creation of a mask for producing a flexographic printing plate.
Figure 7:
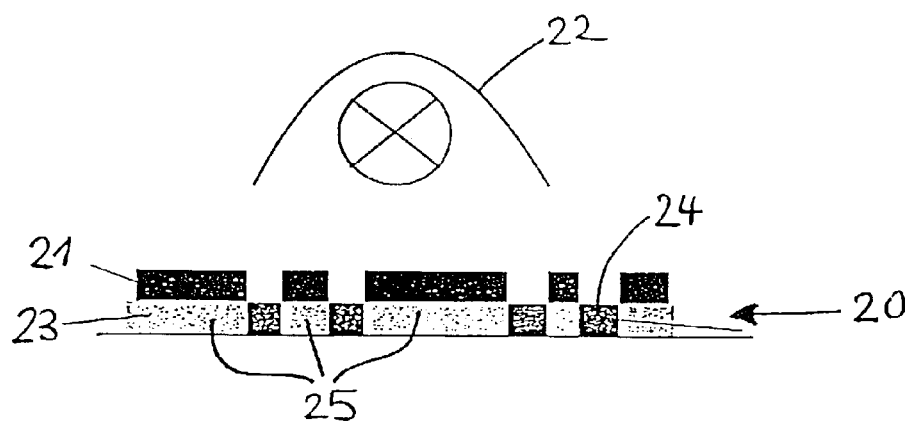
Figure 8:
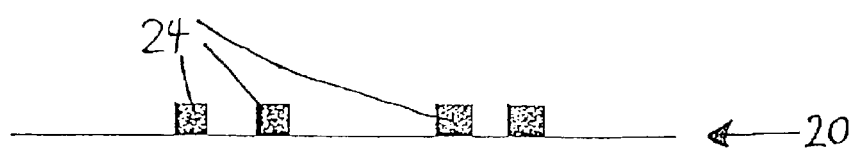
Figure 9:
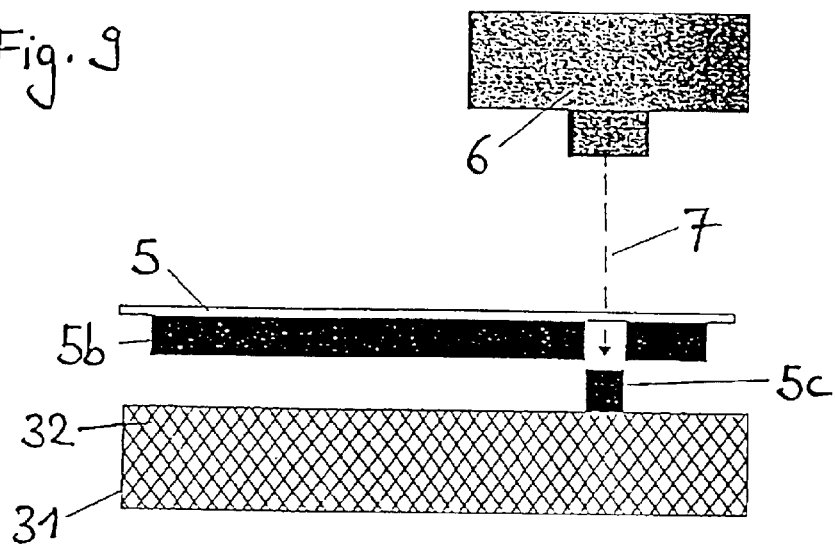
FIGS. 9 to 11 show details of the creation of a mask for producing a screen-printing screen.

FIG. 6 indicates, in a further exemplary embodiment of the present invention, the creation of a mask for producing a flexographic printing plate 20, FIG. 7 outlines a copying process for a flexographic printing plate 20 by means of a mask 21, and FIG. 8 shows a developed flexographic printing plate 20 with the mask already removed.

According to FIGS. 6 to 8, therefore, creating a mask by means of laser-induced thermal transfer can also be used for producing a flexographic printing plate 20. This is a copying process, in which the image information is transferred to a light-sensitive coating 23 on a flexographic printing plate 20 by means of a copying mask 21 and high-energy radiation (e.g. UV light from a copying lamp 22, FIG. 7). With the copying mask 21, differentiation with regard to image points 24 and non-image points 25 (FIGS. 6 and 7) is carried out. A precondition for the copying process for producing a flexographic printing plate 20 is that the flexographic printing cylinder or the sleeve, which can be pushed onto the latter, and also the raw plate, which can be clamped onto an appropriate cylinder, has been pre-coated with a light-sensitive material 23.

This coating is not a constituent part of the production of a flexographic printing plate, but is supplied in prefabricated form, as raw material, by appropriate manufacturers or suppliers. These precoatings include what are known as negative and positive materials, that is the exposure of these copying materials can be carried out firstly by means of a positive copying mask or secondly by means of a negative copying mask.

In the case of a negative copy, the areas (image points 24) affected by the radiation from a copying lamp 22 are changed (e.g. hardened), and the non-irradiated areas (non-image points 25) can be washed out in a development process (FIG. 8).

Therefore, the image points 24 result from the transparent areas of the negative mask 21, the non-image points 25 result from the covered areas of the mask 21. Following the development or the washing out of the flexographic printing plate 20 exposed by means of a negative copy, using an appropriate solution, the hardened image elements 24 stand out as elevations (FIG. 8) and can be used as a flexographic printing plate 20 on a flexographic printing cylinder.

In the case of a positive copy, the areas affected by the high-energy radiation (e.g. UV light) are changed (e.g. destroyed). The non-irradiated areas remain unchanged. During the development process or the washing out of the raw plate or cylinder exposed by means of a positive copy, the areas destroyed by irradiation are washed out with an appropriate solution. The non-irradiated points remain elevated and can in turn be used as a flexographic printing plate.

The mask 21 transferred by means of laser-induced thermal transfer is used in the production of flexographic printing plates only to transfer the image information 5c by means of copy or by means of irradiation with high-energy light (e.g. UV light). The task of the copying mask 21 is to ensure adequate opacity during the irradiation. The image information must be capable of being depicted exactly and with sharp edges. Show-through and faults in the mask 21 lead to faults on the flexographic printing plate 20. For the process step of development or washing out, the copying mask 21 is no longer needed.

The conduct of the mask creation by means of laser-induced thermal transfer is the same as the conduct of that for gravure printing, apart from the fact that, during the mask creation for the production of a flexographic printing plate, both negative copying masks and positive masks can be used. During the production of a flexographic printing plate, the mask is used for the purpose of exposure with high-energy radiation (e.g. UV light) and does not come into contact with liquid media during the transfer of image information. The apparatus for producing the copying mask 21 for producing a flexographic printing plate is identical to that used to create a gravure printing mask.

The advantage here resides in the simultaneous creation of an opaque copying mask and the transfer of the image information. By means of this process, the separation between the masking process and ablative image setting is removed. Thus, two process steps for masking a copying plate can be shortened to one process step. Setting an image by means of a laser diode array permits short image-setting times as a result of lower necessary power outputs and higher advance speeds in the lateral direction parallel to the axis. A further advantage is attributable to the quality of the image setting. As compared with exclusively ablative laser image setting, the resolution capacity of laser-induced image setting is higher. These advantages result firstly in savings in time during the process sequence and secondly in savings in costs in the fittings of the apparatus, as a result of components being saved.

Figure 10:
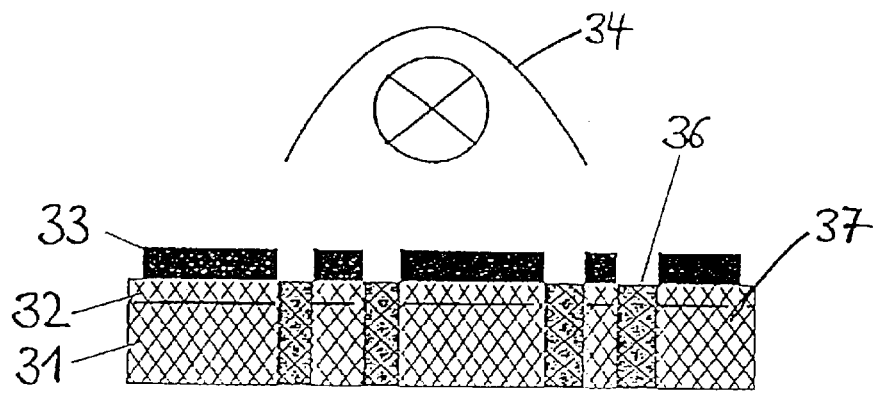
Figure 11:
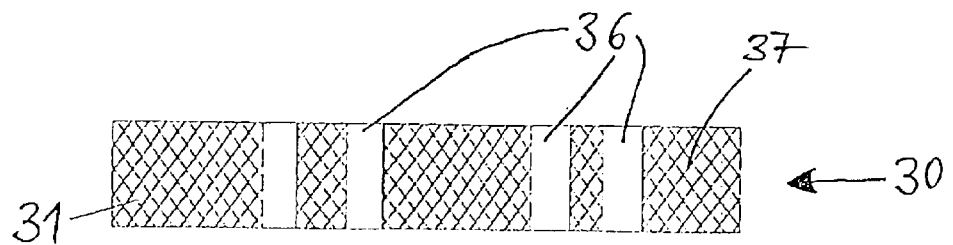
Figure 12:
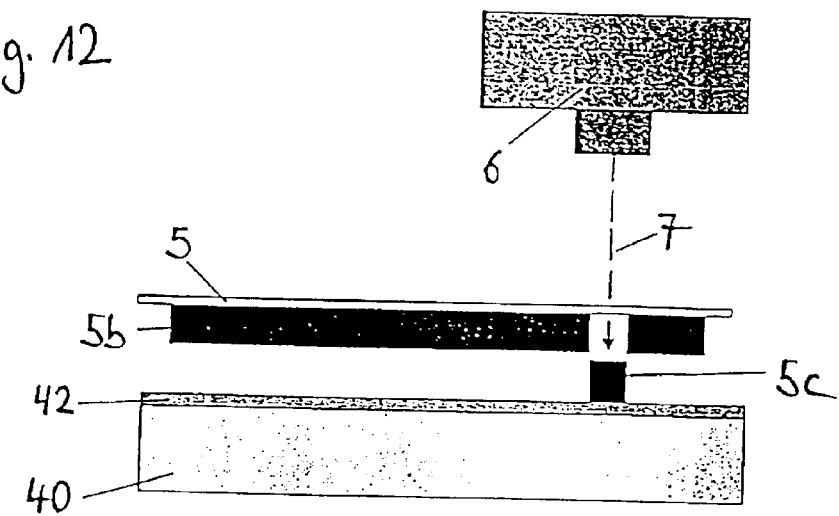
FIGS. 12 to 14 show details of the creation of a mask for producing a screen-printing screen by electroplating.
Figure 13:
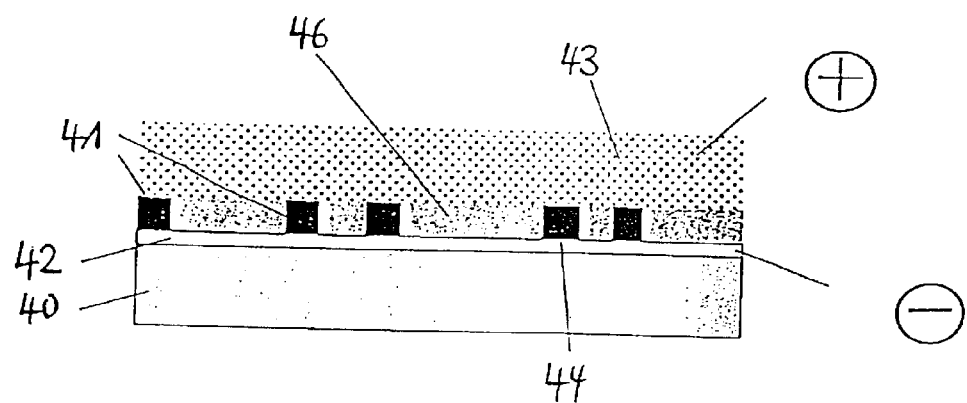
Figure 14:
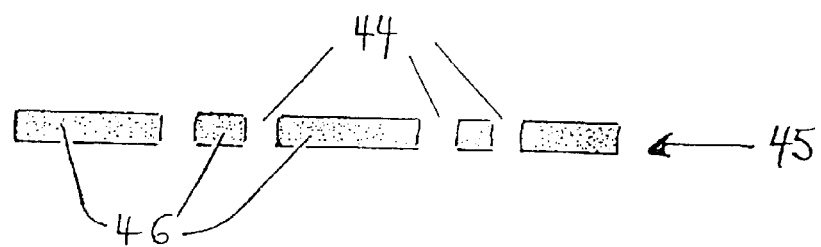

According to FIGS. 9 to 14, creating a mask by means of laser-induced thermal transfer can also be used for producing a screen-printing screen, however. Thus, this may either be a copying process (FIGS. 9 to 11) or a masking process for an electroplating production process (FIGS. 12 to 14).

In the case of the copying process for screen printing (FIG. 9), screen-printing stencils 30 (screen-printing screen, FIG. 11), as they are known, are produced, these mostly being a network-like fabric structure 31 (screen-printing fabric) which is clamped into a frame or a suitable framework. This network-like fabric is coated completely with a light-sensitive layer 32 and can be irradiated with high-energy radiation (e.g. UV light from a copying lamp 34) using a suitable mask 33 to transfer image information 5c.

FIG. 10 shows the copying process for producing a screen-printing screen by means of a mask 33. For the copying process, positive or negative masks can be used, depending on the mask material being used. In the case of negative masks, the exposed areas of the mask become non-image points on the screen-printing screen. The areas of the light-sensitive layer affected by the radiation are hardened and are kept when the printing plate is developed or washed out. Non-hardened areas of the light-sensitive layer on the printing plate are washed out and thus form the permeable image points on the screen-printing screen. In the case of positive masks 33, this functional principle is reversed, that is to say the areas (image points 36) affected by the radiation are destroyed and washed out during development. In this case, the exposed areas become image points 36 and the covered areas become non-image points 37 on the screen-printing screen 30. The mask 33 transferred by means of laser-induced thermal transfer is used only to transfer the image information by means of copying or by irradiation with high-energy light (e.g. UV light) during the production of a screen-printing screen on network-like fabrics 31.

The copying mask 33 must ensure adequate opacity during the irradiation. The image information must be able to be depicted exactly and with sharp edges. Show-through and faults in the mask 33 lead to faults on the screen-printing screen 30. For the process step of development or washing out, the copying mask 33 is no longer needed.

According to FIG. 12, in the case of the electroplating production process for a screen-printing screen (45, FIG. 14), creating a mask by means of laser-induced thermal transfer is used for the purpose of anchoring a mask (positive) 41 on a cylinder (base cylinder 40) with a metallic surface (metal dividing layer 42), the said mask separating the image information into image points 44 and non-image points 46. The metallic cylinder (base cylinder 40, possibly with dividing layer 42), together with the corresponding mask 41, is exposed to an electrolytic bath (electrolyte 43). The thermal transfer material 5b, 5c of the mask 41 in this case serves as an insulator, so that at the points or areas (image points 44) at which the mask 41 is situated on the surface (dividing layer 42) of the base cylinder 40, no electric charge can flow (the metallic dividing layer 42 is negatively charged, the electrolyte 43 is positively charged, FIG. 13). Thus, at these points 44 covered by the mask 41, no deposition of metal can take place, that is to say the action of depositing metal (e.g. copper, nickel) by the electrolyte bath can be controlled in accordance with an image by means of this masking. After the complete electrolytic process (electroplating production process) has been completed, for example a sleeve can be drawn off the metallic cylinder (base cylinder 40), and can then be used as a screen-printing screen 45. At the points 44 at which the positive mask 41 has covered the surface on the base cylinder 40, 42, there are corresponding holes or image points 41 on the screen-printing screen 45 (sleeve) (FIG. 11). During screen printing, these holes serve as ink-carrying points (allowing ink through the screen), through which the ink can be conveyed onto the printing materials by means of appropriate squeegees.

Creating a mask by means of laser-induced thermal transfer is used in this screen-printing screen production process as an image-differentiating electroplating mask 41. In this case, the mask 41 is exposed to a liquid electrolyte bath 43 and must be resistant to dissolution and to liquid running underneath. The image information must be capable of being depicted exactly and with sharp edges. The squeegee-bearing structures needed for the screen printing must be ensured by the laser image setting by means of appropriate generation of image data during the mask creation.

The conduct of the mask creation described previously is the same as the conduct of the gravure printing described at the beginning, apart from the fact that during the creation of a mask for the screen-printing screen production on network-like fabrics, both negative copying masks and positive copying masks can be used. In the case of screen-printing screen production on fabrics, the mask is used for the purpose of exposure with high-energy radiation (e.g. UV light) and does not come into contact with liquid media during the transfer of image information. In the case of screen-printing screen production by electroplating, positive masks are produced by means of laser-induced thermal transfer. In this case, the masking comes into contact with liquid media (electrolyte baths). The apparatus for producing a copying mask for the production of a screen-printing screen is, however, identical to the apparatus for creating gravure printing masks.

The advantage of this laser-induced masking process for the production of screen-printing screens again resides in the simultaneous creation of a mask and the transfer of the image information. By means of this process, the separation between the masking process and the ablative image setting is removed. Thus, two process steps for masking a copying plate or an electroplate can be shortened to one process step. Setting an image by means of laser diode arrays permits short image-setting times as a result of lower necessary power outputs and higher advance speeds in the lateral direction parallel to the axis. A further advantage is attributable to the quality of the image setting. As compared with an exclusively ablative laser image setting, the resolution power of laser-induced image setting is higher. These advantages result firstly in savings in time during the process sequence and secondly in savings in costs in the fittings of the apparatus, as a result of components being saved.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. A method of producing a gravure printing plate in a printing machine, said method comprising providing a thermal transfer film carrying a thermal transfer material in proximity to a surface of a gravure printing plate cylinder in a printing machine, selectively ablating said thermal transfer material using a laser image-setting unit to selectively apply said thermal transfer material directly to the surface of said printing plate cylinder, thereby forming an etching mask directly on said printing plate cylinder in said printing machine, said etching mask defining image points and non-image points directly on said printing plate carrier by covering said non-image points on said cylinder, and etching gravure printing cells by applying acid where said thermal transfer material has not been applied to said surface of said cylinder.

2. A method as in claim 1 wherein said thermal transfer material is selectively applied to a variable area of said surface with a constant thickness during ablation of said transfer material using said laser image setting unit.

3. A method as in claim 1 wherein said thermal transfer material is a polymer material.

4. A method as in claim 1 wherein the surface of the gravure printing cylinder is copper.

* * * * *